(12) United States Patent
Lu et al.

(10) Patent No.: US 10,147,644 B2
(45) Date of Patent: Dec. 4, 2018

(54) ARRAY SUBSTRATE, METHOD FOR MANUFACTURING THE SAME AND DISPLAY DEVICE

(71) Applicants: BOE Technology Group Co., Ltd., Beijing (CN); Hefei Xinsheng Optoelectronics Technology Co., Ltd., Anhui (CN)

(72) Inventors: Yanchun Lu, Beijing (CN); Xuebing Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD, Anhui (CN)

(*) Notice: Subject to any disclaimer, the term of this patent is extended or adjusted under 35 U.S.C. 154(b) by 0 days.

(21) Appl. No.: 15/522,861

(22) PCT Filed: Sep. 29, 2016

(86) PCT No.: PCT/CN2016/100815
§ 371 (c)(1),
(2) Date: Apr. 28, 2017

(87) PCT Pub. No.: WO2017/148144
PCT Pub. Date: Sep. 8, 2017

(65) Prior Publication Data
US 2018/0090378 A1    Mar. 29, 2018

(30) Foreign Application Priority Data

Mar. 1, 2016  (CN) .......................... 2016 1 0115048

(51) Int. Cl.
*H01L 21/02*       (2006.01)
*H01L 21/77*       (2017.01)
(Continued)

(52) U.S. Cl.
CPC ............ *H01L 21/77* (2013.01); *G02F 1/1368* (2013.01); *H01L 21/12* (2013.01); *H01L 23/552* (2013.01); *H01L 27/12* (2013.01)

(58) Field of Classification Search
CPC ... H01L 27/32–27/326; H01L 51/50–51/5012; H01L 51/525–51/5287;
(Continued)

(56) References Cited

U.S. PATENT DOCUMENTS

2004/0179144 A1* 9/2004 Jeon ..................... G02F 1/13454
                                                                  349/43
2009/0148987 A1* 6/2009 Liao ..................... G02F 1/13439
                                                                  438/158
(Continued)

FOREIGN PATENT DOCUMENTS

CN        102902095 A     1/2013
CN        103022055 A     4/2013
(Continued)

OTHER PUBLICATIONS

International Search Report and Written Opinion for International Application No. PCT/CN2016/100815 dated Nov. 10, 2016.
(Continued)

*Primary Examiner* — Cuong B Nguyen
*Assistant Examiner* — Samuel Park
(74) *Attorney, Agent, or Firm* — Calfee Halter & Griswold LLP

(57) ABSTRACT

An array substrate and a method for manufacturing the same, and a display device are provided. The method includes: forming a thin film transistor (TFT) structure of a display region and a TFT structure of the GOA region on a substrate; sequentially forming a first insulating layer, an indium tin oxide (ITO) layer and a photoresist layer on the TFT structure; exposing and developing the photoresist
(Continued)

layer using a halftone mask plate, and etching the ITO layer, to form an electrode layer in the GOA region and an electrode layer in the display region; and ashing the remaining photoresist to completely remove the photoresist on the electrode layer in the display region and to thinning the photoresist on the electrode layer in the GOA region.

8 Claims, 6 Drawing Sheets

(51) Int. Cl.
  *H01L 27/12* (2006.01)
  *G02F 1/1368* (2006.01)
  *H01L 21/12* (2006.01)
  *H01L 23/552* (2006.01)

(58) Field of Classification Search
  CPC ............ H01L 2227/32–2227/326; H01L 2251/5323–2251/5361; H01L 2924/12044; H01L 2021/775; H01L 27/1214; H01L 27/124; H01L 27/3232; H01L 51/0076; H01L 27/14603; H01L 27/14605; H01L 27/14609; H01L 27/14812; H01L 27/3248
  See application file for complete search history.

(56) References Cited

U.S. PATENT DOCUMENTS

| | | | |
|---|---|---|---|
| 2010/0020256 A1* | 1/2010 | Lee | G02F 1/136209 349/39 |
| 2010/0033646 A1* | 2/2010 | Baek | G02F 1/1345 349/42 |
| 2012/0099043 A1 | 4/2012 | Sun et al. | |
| 2013/0140568 A1* | 6/2013 | Miyamoto | H01L 31/0248 257/53 |
| 2014/0353661 A1* | 12/2014 | Seo | H01L 27/3279 257/43 |

FOREIGN PATENT DOCUMENTS

| | | |
|---|---|---|
| CN | 104538413 A | 4/2015 |
| CN | 104658981 A | 5/2015 |
| CN | 105280649 A | 1/2016 |
| CN | 105702685 A | 6/2016 |

OTHER PUBLICATIONS

First Office Action for Chinese Patent Application No. 201601 15048.6 dated Feb. 11, 2018.

* cited by examiner

ARRAY SUBSTRATE, METHOD FOR MANUFACTURING THE SAME AND DISPLAY DEVICE

CROSS-REFERENCE TO RELATED APPLICATIONS

The present application is based upon International Application No. PCT/CN2016/100815, filed on Sep. 29, 2016, which is based upon claims priority to Chinese Patent Application No. 201610115048.6, filed Mar. 1, 2016, the entire contents of which are incorporated herein by reference.

TECHNICAL FIELD

The present disclosure relates to the field of display technology, and more particularly, to an array substrate, a method for manufacturing the same and a display device.

BACKGROUND

With the development of thin film transistor-liquid crystal display (TFT-LCD) technology, especially the demand of a screen having small size for a narrow bezel is increasingly high, such that the gate drive on array (GOA) technology is used more frequently. The GOA technology can integrate a gate driver circuit on a TFT substrate rather than outside the region where the TFT substrate is located, thereby reducing a bezel of a panel, making the panel more compliant with the technology development trend.

In the design of a twisted nematic (TN) type display panel, due to the characteristics of the principle of liquid crystal deflection, an indium tin oxide (ITO) electrode layer at a side of a color film substrate should be conductively connected with a pixel electrode at a side of the array substrate side by using an Au ball in a sealant. However, for the TN type panels having the GOA design, a driver circuit of the GOA region is designed with a number of via holes, and if the array substrate is conductive with the ITO electrode layer at the side of the color film substrate at the via holes of the GOA region, a display defect is caused. The TN type display panel in the related art is designed to coating a packaging adhesive at a certain distance from the GOA region, which results in a wider width of the bezel of the TN type display panel than that of a bezel of an advanced super dimension switch (ADS) type display panel.

It should be noted that, information disclosed in the above background portion is provided only for better understanding of the background of the present disclosure, and thus it may contain information that does not form the prior art known by those skilled in the art.

SUMMARY

The present disclosure provides an array substrate, a method for manufacturing the same and a display device.

In a first aspect, the present disclosure provides a method for manufacturing an array substrate, the array substrate comprising a display region and a GOA region, and the method comprising:

forming a thin film transistor (TFT) structure of the display region and a TFT structure of the GOA region on a substrate, wherein the TFT structure of the GOA region comprises a gate line metal layer and a data line metal layer;

sequentially forming a first insulating layer, an indium tin oxide (ITO) layer and a photoresist layer on the TFT structure of the display region and the TFT structure of the GOA region;

exposing and developing the photoresist layer using a halftone mask plate, and etching the ITO layer, to form an electrode layer in the GOA region and an electrode layer in the display region, wherein a remaining photoresist on the electrode layer in the GOA region has a greater thickness than that of a remaining photoresist on the electrode layer of the display region; and ashing the remaining photoresist to completely remove the photoresist on the electrode layer in the display region and to thinning the photoresist on the electrode layer in the GOA region, wherein the electrode layer in the GOA region is connected with the gate line metal layer through a first via hole, and the electrode layer in the GOA region is connected to the data line metal layer through a second via hole.

In a second aspect, the present disclosure provides an array substrate, comprising:

a gate drive on array (GOA) region, comprising a TFT structure of the GOA region, and a first insulating layer, an electrode layer in the GOA region and a second insulating layer sequentially formed on the TFT structure of the GOA region, wherein the electrode layer in the GOA layer is connected with a gate line metal layer of the TFT structure of the GOA region through a first via hole penetrating through the first insulating layer and a gate insulating layer of the TFT structure of the GOA region, and the electrode layer in the GOA layer is connected with a data line metal layer of the TFT structure of the GOA region through a second via hole penetrating through the first insulating layer; and a display region, comprising a TFT structure of the display region, and a first insulating layer and an electrode layer in the display region sequentially formed on the TFT structure of the display region, wherein the electrode layer in the display region is connected with a source/drain electrode layer of the TFT structure of the display region through a third via hole penetrating through the first insulating layer, wherein the second insulating layer completely covers the electrode layer in the GOA region.

In a third aspect, the present disclosure provides a display device comprising any one array substrate described as above, and a color film substrate.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions in embodiments of the present disclosure or in the prior art, the following drawings to be used in the description of the embodiments or in the prior art will be briefly introduced below. Apparently, the drawings in the following description are only for some embodiments of the disclosure, those of ordinary skill in the art may also obtain other drawings from these drawings, without creative efforts.

DESCRIPTION OF REFERENCE NUMERALS IN FIGS. 3 TO 15

1: substrate; 2: gate electrode layer; 3: gate line metal layer; 4: gate insulating layer; 5: active layer; 6: source/drain electrode layer; 7: data line metal layer; 8: first insulating layer; 13: ITO metal layer; 10: photoresist layer; 11: electrode layer in GOA region; 12: electrode layer in display region; 13: sealant; 14: ITO electrode layer; 15: light shielding layer; 16: second insulating layer.

DETAILED DESCRIPTION

Hereinafter, implementations of the embodiments of the present disclosure will be illustrated clearly and fully with reference to the drawings. It will be apparent that the described embodiments are merely part of the embodiments and not all of the embodiments of the present disclosure. All other embodiments obtained by those of ordinary skill in the art without making creative work are within the scope of this disclosure, based on the embodiments of the present disclosure.

Figure 2:
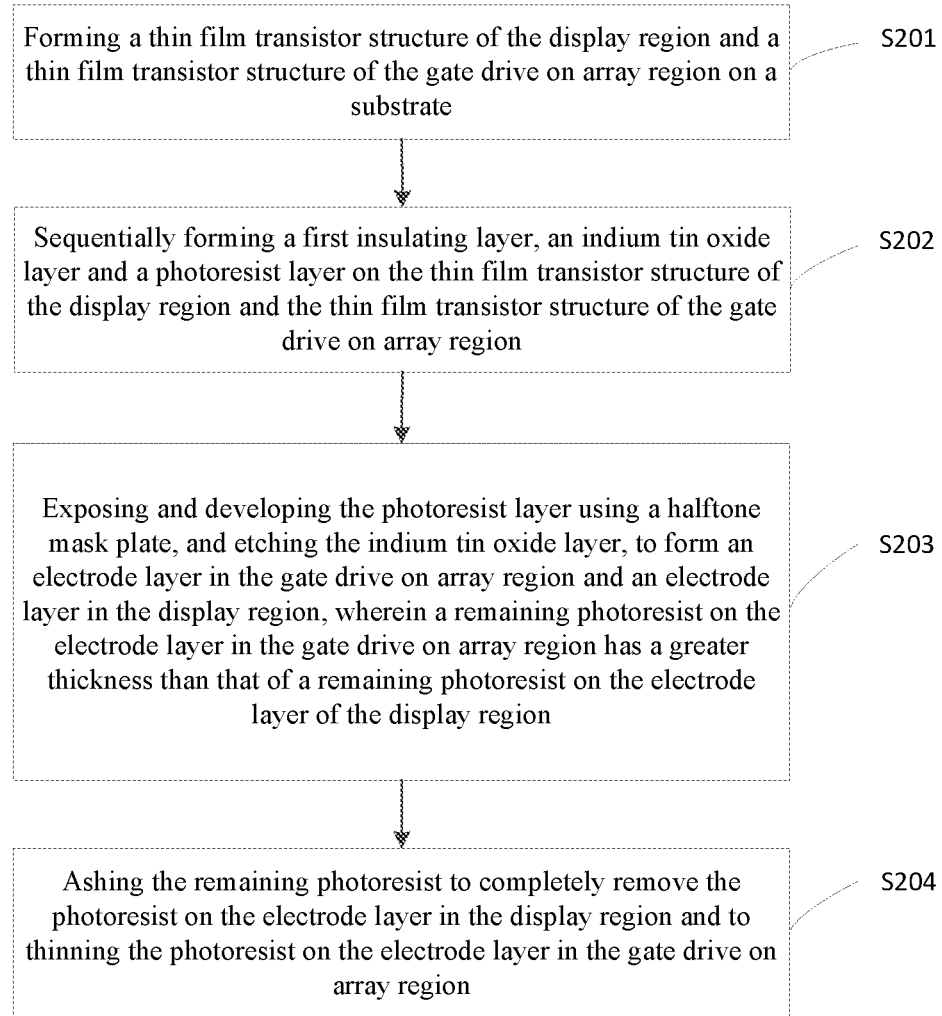
FIG. 2 is a schematic flow diagram of a method for manufacturing an array substrate provided by some embodiments of the present disclosure.

FIG. 2 is a schematic flow diagram of a method for manufacturing an array substrate provided by some embodiments of the present disclosure. The array substrate in the present embodiment comprises a display region and a GOA (gate drive on array) region. As shown in FIG. 2, the method for manufacturing an array substrate in the present embodiment specifically comprises the following steps.

At step S201, a thin film transistor (TFT) structure of a display region and a TFT structure of the GOA region is formed on a substrate.

For example, the TFT structure of the display region may comprise a gate electrode layer, a gate insulating layer, an active layer and a source/drain electrode layer. The TFT structure of the GOA region may specifically comprise a gate line metal layer, a gate insulating layer, a data line metal layer and the like.

At step S202, a first insulating layer, an indium tin oxide (ITO) layer and a photoresist layer are sequentially formed on the TFT structure of the display region and the TFT structure of the GOA region.

At step S203, the photoresist layer is exposed and developed using a halftone mask plate, and the ITO layer is etched, to form an electrode layer in the GOA region and an electrode layer in the display region, wherein a remaining photoresist on the electrode layer in the GOA region has a greater thickness than that of a remaining photoresist on the electrode layer of the display region.

At step S204, the remaining photoresist is subjected to an ashing process to completely remove the photoresist on the electrode layer in the display region and to thinning the photoresist on the electrode layer in the GOA region.

The electrode layer in the GOA region is connected with the gate line metal layer through a first via hole, and the electrode layer in the GOA region is connected to the data line metal layer through a second via hole.

Compared with the prior art, in the embodiments of the present disclosure, the photoresist layer is exposed and developed by using the halftone mask plate, such that the thickness of the remaining photoresist on the electrode layer in the GOA region on the array substrate is larger than that of the remaining photoresist on the electrode layer in the display region. Thus a part of the photoresist on the GOA region may remain after the remaining photoresist is subjected to an ashing process, such that the photoresist can cover the via holes on the GOA region. In this case, if a sealant is applied on the GOA region, the via holes do not cause the array substrate to be conductive with the ITO electrode layer at the side of the color film substrate at the via holes, such that the bezel of the panel is further reduced to form a TN type display panel having a narrow bezel.

In the present embodiment, the electrode layer in the display region may be a pixel electrode.

In the present embodiment, the step S203 may be specifically achieved by following steps A01 and A02.

At step A01, after the photoresist layer is exposed and developed using the halftone mask plate, a photoresist completely removed region and a photoresist completely remained region in the GOA region are formed, and a photoresist completely removed region and a photoresist partially remained region in the display region are formed.

The halftone mask plate comprises an opaque sub-mask plate corresponding to the electrode layer in the GOA region, a fully transparent sub-mask plate corresponding to a region other than the electrode layer in the GOA region, a semi-transparent sub-mask plate corresponding to the electrode layer in the display region, and a fully transparent sub-mask plate corresponding to a region other than the electrode layer in the display region.

It can be understood that, the photoresist completely remained region in the GOA region corresponds to the opaque sub-mask plate, the photoresist completely removed region in the GOA region corresponds to the fully transparent sub-mask plate, the photoresist partially remained region in the display region corresponds to the semi-transparent sub-mask plate, and the photoresist completely removed region in the display region corresponds to the fully transparent sub-mask plate.

The photoresist layer in the photoresist partially remained region may be thinned after exposure and development.

At step A02, the ITO layer is etched, such that the electrode layer in the GOA region is formed in the photoresist completely remained region, and the electrode layer in the display region is formed in the photoresist partially remained region.

Therefore, through the above steps, the photoresist on the electrode layer in the GOA region has a greater thickness than that of a remaining photoresist on the electrode layer of the display region. Thus a part of the photoresist can remain on the GOA region after the photoresist is subjected to ashing treatment, such that the via holes in the GOA area may be isolated by the photoresist.

In the present embodiment, the step S202 may be specifically achieved by following steps B01, B02, B03 and B04.

At step B01, the first insulating layer is formed on the TFT structure of the display region and the TFT structure of the GOA region.

At step B02, in the GOA region, the first via hole penetrating through the first insulating layer and the gate insulating layer and exposing the gate line metal layer is formed, and a second via hole penetrating through the first insulating layer and exposing the data line metal layer is formed.

At step B03, in the display region, a third via hole penetrating through the first insulating layer and exposing the source/drain electrode layer is formed.

At step B04, the ITO layer and the photoresist layer are sequentially formed on the first via hole, the second via hole, the third via hole, and the first insulating layer.

In particular, the GOA region is provided with at least one first via hole and at least one second via hole, the gate line metal layer of the TFT structure of the GOA region is disposed at the bottom of the first via hole, and the data line metal layer of the TFT structure of the GOA region is disposed at the bottom of the second via hole. Therefore, the photoresist remains on the electrode layer in the GOA region, and the photoresist remains on the first via hole and the second via hole in the GOA region. Thus, since the via holes are formed in the GOA region, and the photoresist can cover the via holes in the GOA region, the coating of the sealant on the GOA region does not cause the array substrate to be conductive with the ITO layer at the side of the color film substrate at the via holes.

Further, after step S204, the method for manufacturing an array substrate in the present embodiment further comprises a following step S205, which is not shown in FIG. 2.

At step S205, the remaining photoresist on the electrode layer in the GOA region is thermally cured by an annealing process.

Further, the method for manufacturing an array substrate in the present embodiment further comprises a following step.

A sealant is applied on the photoresist on the electrode layer in the GOA region.

The sealant is used for bonding the array substrate to a color film substrate.

It can be seen that, in the present embodiment, the sealant is further applied on the electrode layer in the GOA region of the array substrate to bond the array substrate with the color film substrate. Compared with the prior art in which a distance of about 200 μm between the GOA region and the sealant coating region is required to be reserved, the sealant is directly applied on the GOA region in the present embodiment, which does not cause the via holes to be conductive with the ITO layer at the side of the color film substrate, such that the bezel of the panel is further reduced.

In order to more clearly illustrate the technical solutions of the present disclosure, some specific embodiments of the present disclosure are described below in connection with a schematic cross-sectional views of the device structure formed in each step. In this embodiment, as shown in the final product structure shown in FIG. 14, the array substrate comprises a display area and a GOA area. Of course, the array substrate may also comprise other structures, which will not be described here. It is to be understood that the structures shown herein are exemplary and may have other structural forms in accordance with the scope and spirit of the present disclosure as defined by the appended claims.

Figure 16:
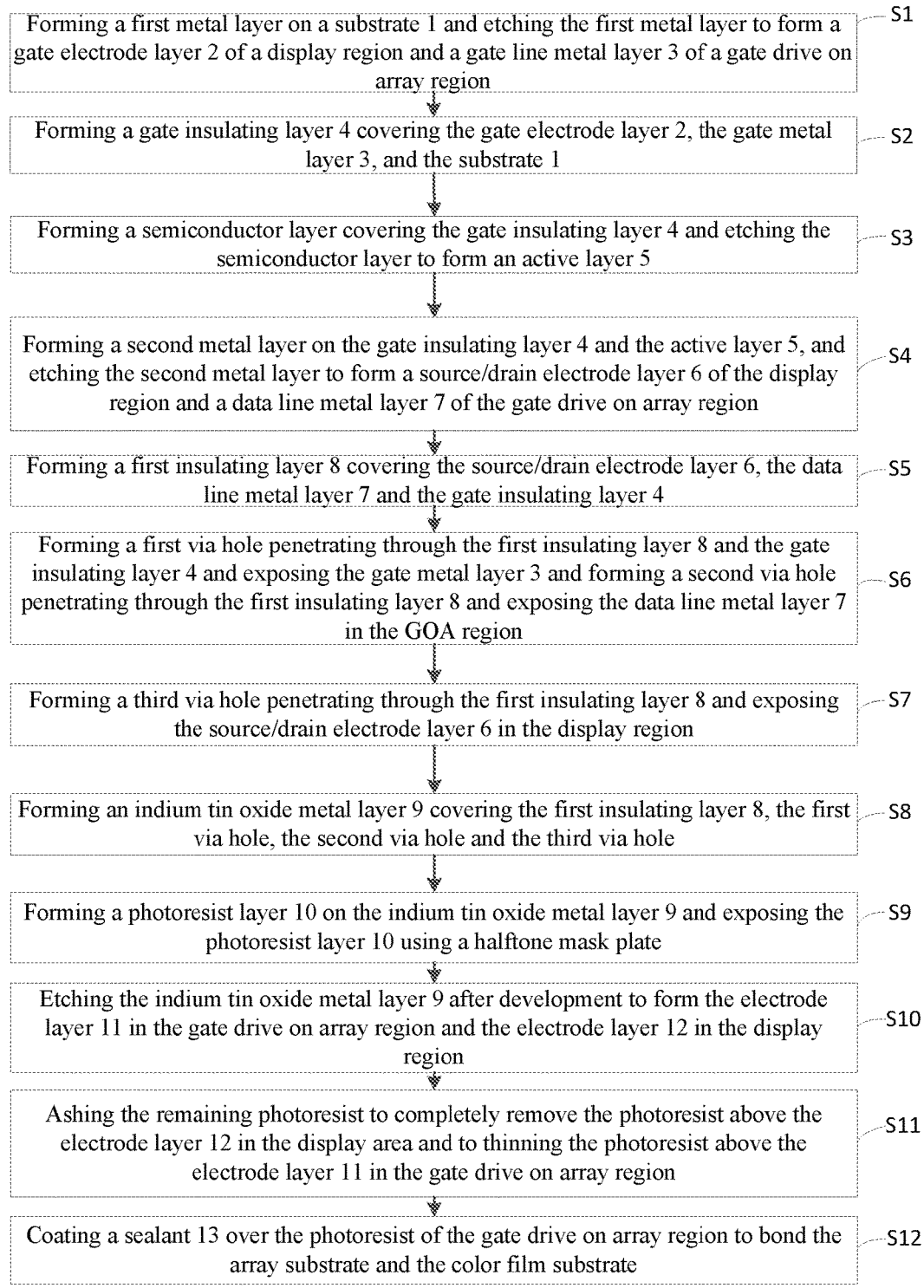
FIG. 16 is a schematic flow diagram of a method for manufacturing an array substrate provided by some embodiments of the present disclosure.

As shown in FIG. 16, the method for manufacturing the array substrate in this embodiment may specifically comprise the following steps.

Figure 3:
FIG. 3 is a schematic view of forming a gate electrode layer and a gate line metal layer in an array substrate provided by some embodiments of the present disclosure.

At step S1, a first metal layer is formed on a substrate 1 and the first metal layer is etched to form a gate electrode layer 2 of a display region and a gate line metal layer 3 of a GOA region, as shown in FIG. 3.

In general, the substrate 1 may be a material such as glass, plastic or silicon. A metal layer is formed by depositing a metal or an alloy such as molybdenum (Mo), aluminum/neodymium (Al/Nd), aluminum/neodymium/molybdenum (Al/Nd/Mo), molybdenum/aluminum/neodymium/molybdenum (Mo/Al/Nd/Mo), gold/titanium (Au/Ti), platinum/titanium (Pt/Ti) or the like by a sputtering method, and the metal layer is photolithographically etched to form the gate electrode layer 2 and the gate line metal layer 3.

Figure 4:
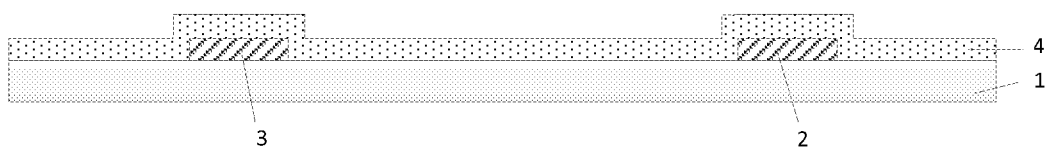
FIG. 4 is a schematic view of forming a gate insulating layer in an array substrate provided by some embodiments of the present disclosure.

At step S2, a gate insulating layer 4 covering the gate electrode layer 2, the gate metal layer 3, and the substrate 1 is formed, as shown in FIG. 4.

For example, a monolayer or multilayer of an oxide, a nitride and/or an oxynitride such as silicon oxide ($SiO_x$), silicon nitride ($SiN_x$), silicon oxynitride (SiON), alumina ($Al_2O_3$), hafnium oxide ($HfO_2$), zirconium oxide ($ZrO_2$), titanium oxide ($TiO_2$), yttrium oxide ($Y_2O_3$), lanthanum oxide ($La_2O_3$), tantalum oxide ($Ta_2O_5$) or the like are deposited by atmospheric pressure chemical vapor deposition, low pressure chemical vapor deposition, plasma assisted chemical vapor deposition or sputtering, to form the gate insulating layer 4.

Figure 5:
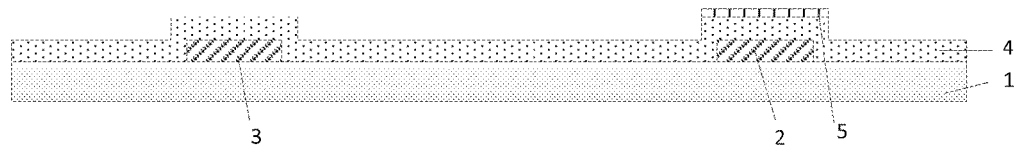
FIG. 5 is a schematic view of forming an active layer in an array substrate provided by some embodiments of the present disclosure.

At step S3, a semiconductor layer covering the gate insulating layer 4 is formed and the semiconductor layer is etched to form an active layer 5, as shown in FIG. 5.

For example, the semiconductor layer is formed by depositing an oxide such as indium gallium zinc oxide (IGZO), zinc oxynitride (ZnON), indium tin zinc oxide (ITZO), zinc tin oxide (ZTO), zinc indium oxide (ZIO), indium gallium oxide (IGO), aluminum zinc tin oxide (AZTO), and the like using sputtering, sol-gel, vacuum deposition, spraying or inkjet printing methods, and the semiconductor layer is etched to form the active layer 5.

Figure 6:
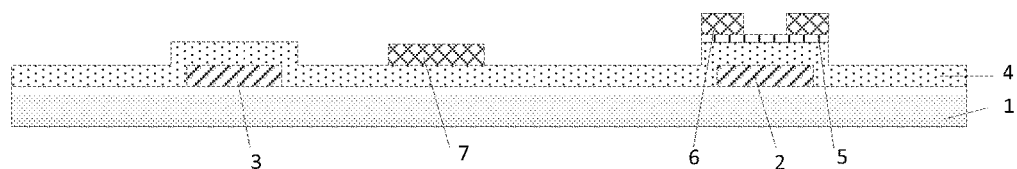
FIG. 6 is a schematic view of forming a source/drain electrode layer and a data line metal layer in an array substrate provided by some embodiments of the present disclosure.

At step S4, a second metal layer is formed on the gate insulating layer 4 and the active layer 5, and the second metal layer is etched to form a source/drain electrode layer 6 of the display region and a data line metal layer 7 of the GOA region, as shown in FIG. 6.

In particular, a second metal layer is formed by depositing a metal or an alloy such as molybdenum (Mo), aluminum/neodymium (Al/Nd), aluminum/neodymium/molybdenum (Al/Nd/Mo), molybdenum/aluminum/neodymium/molybdenum (Mo/Al/Nd/Mo), gold/titanium (Au/Ti), platinum/titanium (Pt/Ti) or the like by a sputtering method, and the second metal layer is photolithographically etched to form the source/drain electrode layer 6 and the data line metal layer 7.

Figure 7:
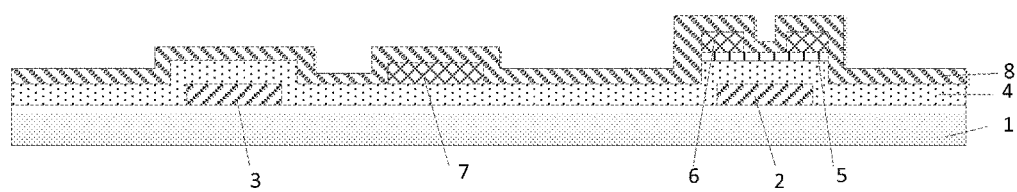
FIG. 7 is a schematic view of forming a first insulating layer in an array substrate provided by some embodiments of the present disclosure.

At step S5, a first insulating layer 8 covering the source/drain electrode layer 6, the data line metal layer 7, and the gate insulating layer 4 is formed, as shown in FIG. 7.

In particular, the first insulating layer 8 may be a passivation layer, and thermal growth, atmospheric chemical vapor deposition, low pressure chemical vapor deposition, plasma assisted chemical vapor deposition, sputtering and the like may be used.

Figure 8:
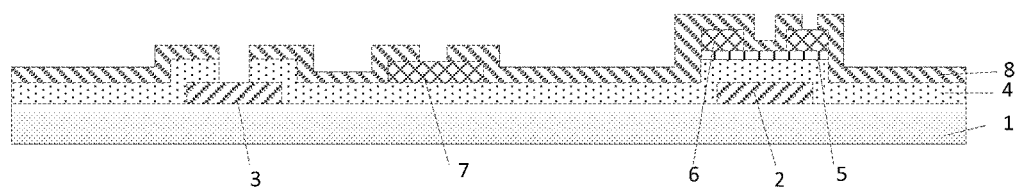
FIG. 8 is a schematic view of forming a first via hole, a second via hole and a third via hole in an array substrate provided by some embodiments of the present disclosure.

At step S6, in the GOA region, a first via hole penetrating through the first insulating layer 8 and the gate insulating layer 4 and exposing the gate metal layer 3 is formed, and a second via hole penetrating through the first insulating layer 8 and exposing the data line metal layer 7 is formed, as shown in FIG. 8.

It is understood that the GOA region is provided with at least one first via hole and at least one second via hole, the bottom of the first via hole is the gate metal layer 3 of the TFT structure of the GOA region and the bottom of the second via hole is the data line metal layer 7 of the TFT structure of GOA region.

At step S7, a third via hole penetrating through the first insulating layer 8 and exposing the source/drain electrode layer 6 is formed in the display region, as shown in FIG. 8.

It is understood that the display region is provided with a third via hole for connecting the electrode layer (e.g., pixel electrode) in the display region with the source/drain electrode layer 6, and the bottom of the third via hole is the source/drain electrode layer 6.

Figure 9:
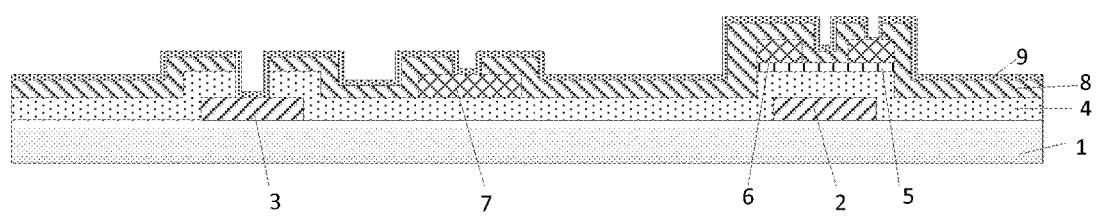
FIG. 9 is a schematic view of forming an ITO metal layer in an array substrate provided by some embodiments of the present disclosure.

At step S8, an ITO metal layer 9 covering the first insulating layer 8, the first via hole, the second via hole and the third via hole is formed, as shown in FIG. 9.

Figure 10:
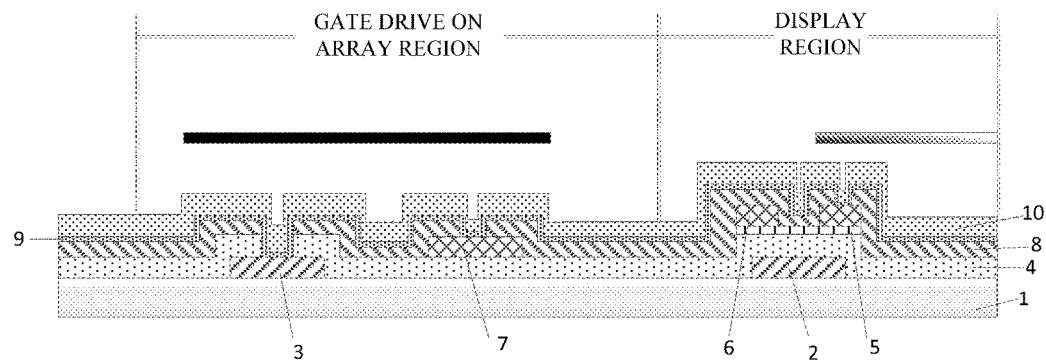
FIG. 10 is a schematic view of forming a photoresist layer in an array substrate provided by another embodiment of the present disclosure.

At step S9, a photoresist layer 10 is formed on the ITO metal layer 9 and the photoresist layer 10 is exposed using a halftone mask plate, as shown in FIG. 10.

In the present embodiment, the halftone mask plate comprises an opaque mask plate corresponding to the electrode layer in the GOA region, a semi-transparent mask plate corresponding to the electrode layer in the display region, and a fully transparent mask plate corresponding to other regions, as shown in FIG. 10. The semi-transparent mask plate causes the photoresist on the electrode layer in the display area to be thinned after exposure and development, and the opaque mask plate causes the photoresist on the electrode layer in the GOA region to have a constant thickness after exposure and development. The photoresist of other areas is completely removed after exposure and development.

At step S10, the ITO metal layer 9 is etched after development to form the electrode layer 11 in the GOA region and the electrode layer 12 in the display region.

Figure 11:
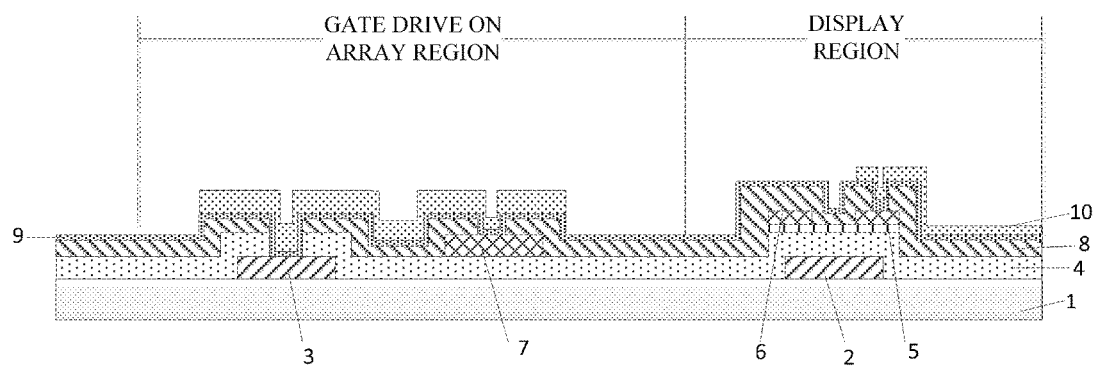
FIG. 11 is a schematic view of having been subjected to a development in an array substrate provided by some embodiments of the present disclosure.

It should be noted that, in the present embodiment, a thickness of the remaining photoresist above the electrode layer in the GOA region after development is larger than that of the remaining photoresist above the electrode layer in the display region, as shown in FIG. 11, and the photoresist of other areas except the electrode layer in the GOA region and the electrode layer in the display region is completely removed.

Figure 12:
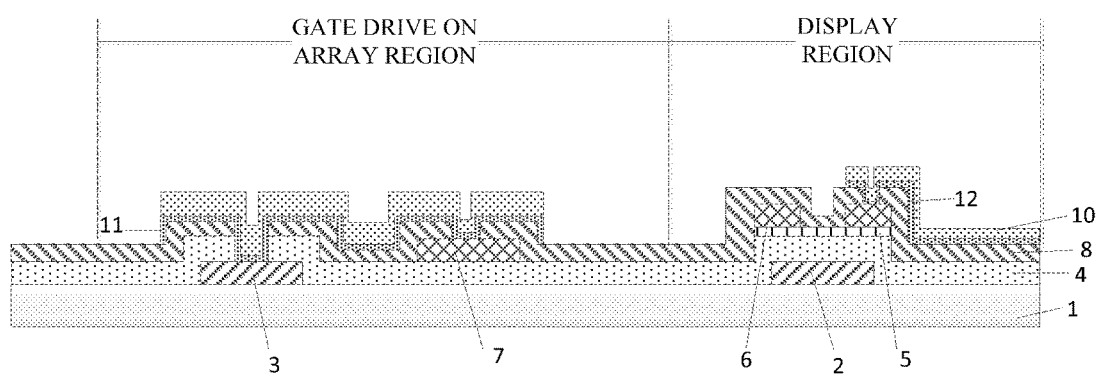
FIG. 12 is a schematic view of forming an electrode layer in a GOA region and an electrode layer in a display region in an array substrate provided by some embodiments of the present disclosure.

Further, the ITO metal layer 9 is subjected to wet etching after development to form the electrode layer 11 in the GOA region and the electrode layer 12 in the display region, as shown in FIG. 12.

Figure 13:
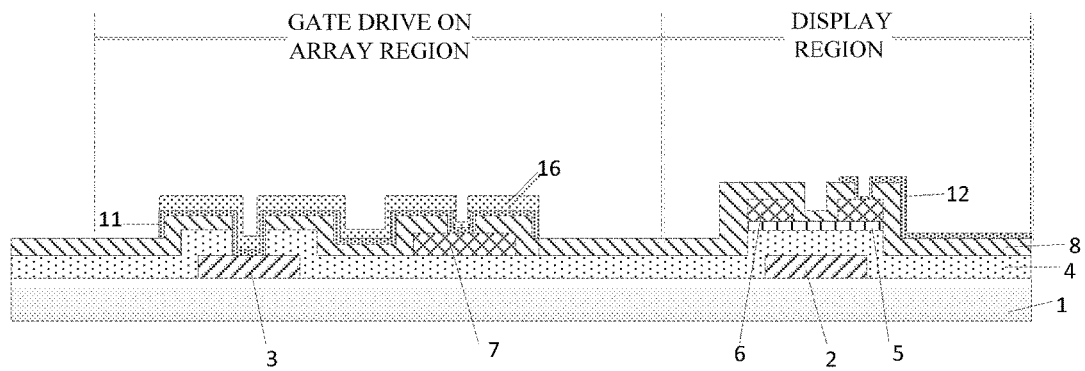
FIG. 13 is a schematic view of an array substrate provided by some embodiments of the present disclosure.

At step S11, the remaining photoresist is ashed to completely remove the photoresist above the electrode layer 12 in the display area and to thinning the photoresist above the electrode layer 11 in the GOA region, as shown in FIG. 13.

In this case, a layer of photoresist covering the electrode layer in the GOA region may remain in the GOA region.

Figure 14:
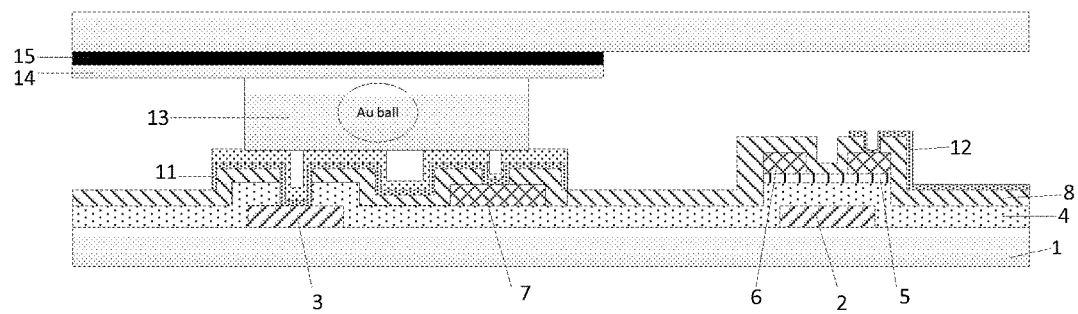
FIG. 14 is a schematic view of forming a sealant in an array substrate provided by some embodiments of the present disclosure.
Figure 15:
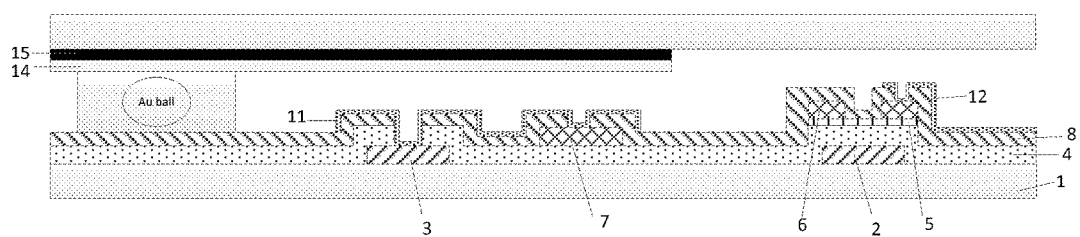
FIG. 15 is a schematic view of sealing an array substrate and a color film substrate in the prior art.

At step S12, a sealant 13 is coated over the photoresist of the GOA region to bond the array substrate and the color film substrate, as shown in FIG. 14.

As shown in FIG. 14, the sealant 13 contains a gold ball (Au ball), and the color film substrate comprises an ITO electrode layer 14 and a light shielding layer 15 corresponding to the portion of the sealant 13.

Figure 1:
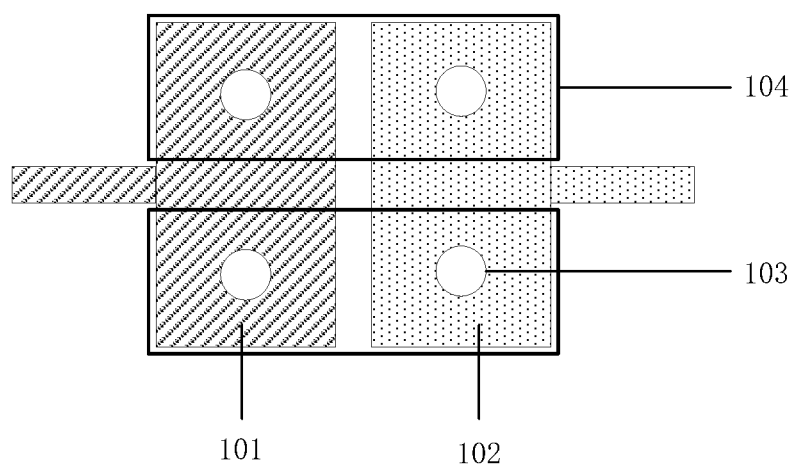
FIG. 1 is a schematic view of a typical via hole design of the GOA region in the prior art.

FIG. 1 is a schematic view of a typical via hole design of the GOA region in the prior art, wherein the reference numeral 101 denotes a gate line metal, the reference numeral 102 denotes a data line metal, the reference numeral 103 denotes a via hole penetrating through a gate insulating layer and a passivation layer (GI/PVX via hole), and the reference numeral 104 denotes an ITO layer connecting two layers of metals 101 and 102. Since there are many via holes 103 in the GOA region, it is possible to cause a display defect if the array substrate is conductive to the ITO electrode layer at the side of the color film substrate at the via holes. In view of this, the coating position of the sealant in the related art is spaced from the GOA region by a predetermined distance, such that the bezel of the display panel is wider. Compared with the related art, as shown in FIG. 14, the method for manufacturing the array substrate proposed in the present embodiment directly applies the sealant 13 on the photoresist disposed on the electrode layer in the GOA region, which can greatly reduce the width of the bezel of the display panel and facilitate the formation of the TN type panel having a narrow bezel.

Some embodiments of the present disclosure provide an array panel, and as shown in FIG. 13, the array panel of the present embodiment comprises a GOA region and a display region.

In particular, the GOA region comprises a TFT structure of the GOA region, and a first insulating layer 8, an electrode layer 11 in the GOA region and a second insulating layer 16 sequentially formed on the TFT structure of the GOA region, wherein the electrode layer 11 in the GOA layer is connected with a gate line metal layer 3 of the TFT structure of the GOA region through a first via hole penetrating through the first insulating layer 8 and a gate insulating layer 4 of the TFT structure of the GOA region, and the electrode layer 11 in the GOA layer is connected with a data line metal layer 7 of the TFT structure of the GOA region through a second via hole penetrating through the first insulating layer 8.

The display region comprises a TFT structure of the display region, and a first insulating layer 8 and an electrode layer 12 in the display region sequentially formed on the TFT structure of the display region, wherein the electrode layer 12 in the display region is connected with a source/ drain electrode layer 6 of the TFT structure of the display region through a third via hole penetrating through the first insulating layer 8.

The second insulating layer completely covers the electrode layer 11 in the GOA region.

The electrode layer 12 in the display region is a pixel electrode.

It can be seen that this embodiment allows the second insulating layer to be formed above the electrode layer in the GOA region, such that the second insulating layer can cover the via holes in the GOA region. Thus, if the sealant is applied on the GOA region, the via holes do not cause the array substrate to be conductive with the ITO electrode layer at the side of the color film substrate at the via holes, such that the bezel of the panel is further reduced to form a TN type display panel having a narrow bezel.

Optionally, the second insulating layer may be a photoresist.

As shown in FIG. 14, in some embodiments of the present disclosure, the second insulating layer 16 of the GOA region is covered with a sealant 13 for bonding the array substrate with the color film substrate.

The array substrate provided by the embodiments of the present disclosure may be manufactured by the method for manufacturing any one of the above-described array substrates, and will not be described in detail herein.

In accordance with the same inventive concept, some embodiments of the present disclosure provide a display device comprising any one of the above-described array substrates, which may be a liquid crystal display panel, a mobile phone, a tablet computer, a television set, a notebook computer, a digital photo frame, a navigator, or any product or component having a display function. Since the display device comprises any one of the above-described array substrates, the same technical problem can be solved and the same technical effects can be obtained.

In the description of the present disclosure, it is to be noted that the azimuth or positional relationship indicated by the terms "upper", "lower" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the disclosure. The term "disposed", "connected" or "bonding" should be broadly understood, for example, it may be a fixed connection, a detachable connection, or an integral connection; or may be a mechanical connection, and also be an electrical connection; can be direct connection, can also be indirectly connected through an intermediate medium, or can be a connectivity within two components. The specific meanings of the above terms in the present disclosure may be understood by those of ordinary skill in the art in light of specific circumstances.

It is also to be understood that in this context, relational terms such as first, second or the like are used only to distinguish one entity or operation from another entity or operation without necessarily requiring or implying that there is any such actual relationship or sequence between these entities or operations. Moreover, the term such as "comprising", "including" or any other variant thereof is intended to encompass a non-exclusive inclusion such that processes, methods, articles or devices that include a series of elements include not only those elements but also those that are not explicitly listed, or include other elements that are inherent to such processes, methods, articles or devices.

In the absence of more restrictions, the elements defined by the statement "including a . . . " do not preclude the presence of additional same elements in the process, method, article, or device that includes the elements.

The foregoing embodiments are merely illustrative of the technical solutions of the present disclosure and are not intended to be limiting thereof. Although the present disclosure has been described in detail with reference to the foregoing embodiments, it will be understood by those of ordinary skill in the art that it is still possible to modify the technical solutions recited in each of the foregoing embodiments, or to equivalently replace some of the technical features therein. Such modifications or substitutions do not cause the essence of the corresponding technical solution to be departed from the spirit and scope of the technical solution of each embodiment.

What is claimed is:

1. A method for manufacturing an array substrate, the array substrate comprising a display region and a gate drive on array (GOA) region, the method comprising:

forming a thin film transistor (TFT) structure of the display region and a TFT structure of the GOA region on a substrate, wherein the TFT structure of the GOA region comprises a gate line metal layer and a data line metal layer;

sequentially forming a first insulating layer, an indium tin oxide (ITO) layer and a photoresist layer on the TFT structure of the display region and the TFT structure of the GOA region;

exposing and developing the photoresist layer using a halftone mask plate, and etching the ITO layer, to form an electrode layer in the GOA region and an electrode layer in the display region, wherein a remaining photoresist on the electrode layer in the GOA region has a greater thickness than that of a remaining photoresist on the electrode layer of the display region; and ashing the remaining photoresist to completely remove the photoresist on the electrode layer in the display region and to thin the photoresist on the electrode layer in the GOA region, wherein the electrode layer in the GOA region is connected with the gate line metal layer through a first via hole, and the electrode layer in the GOA region is connected to the data line metal layer through a second via hole.

2. The method of claim 1, wherein the step of exposing and developing the photoresist layer using the halftone mask plate, and etching the ITO layer, to form the electrode layer in the GOA region and the electrode layer in the display region comprises:

forming a photoresist completely removed region and a photoresist completely remained region in the GOA region and forming a photoresist completely removed region and a photoresist partially remained region in the display region, after exposing and developing the photoresist layer using the halftone mask plate; and etching the ITO layer to form the electrode layer in the GOA region in the photoresist completely remained region of the GOA region and form the electrode layer in the display region in the photoresist partially remained region in the display region.

3. The method of claim 2, wherein the halftone mask plate comprises an opaque sub-mask plate corresponding to the electrode layer in the GOA region, a fully transparent sub-mask plate corresponding to a region other than the electrode layer in the GOA region, a semi-transparent sub-mask plate corresponding to the electrode layer in the display region, and a fully transparent sub-mask plate corresponding to a region other than the electrode layer in the display region.

4. The method of claim 1 further comprising:
applying a sealant on the photoresist on the electrode layer in the GOA region,
wherein the sealant is used for bonding the array substrate to a color film substrate.

5. The method of claim 1, wherein the TFT structure of the GOA region further comprises a gate insulating layer, and the TFT structure of the display region comprises a source/drain electrode layer,
the step of sequentially forming the first insulating layer, the ITO layer and the photoresist layer on the TFT structure of the display region and the TFT structure of the GOA region comprises:
forming the first insulating layer on the TFT structure of the display region and the TFT structure of the GOA region;
forming the first via hole penetrating through the first insulating layer and the gate insulating layer and exposing the gate line metal layer, and forming a second via hole penetrating through the first insulating layer and exposing the data line metal layer, in the GOA region;
forming a third via hole penetrating through the first insulating layer and exposing the source/drain electrode layer in the display region; and
sequentially forming the ITO layer and the photoresist layer on the first via hole, the second via hole, the third via hole, and the first insulating layer.

6. The method of claim 1, wherein the electrode layer in the display region is a pixel electrode.

7. The method of claim 1 further comprising:
thermally curing the remaining photoresist on the electrode layer in the GOA region by an annealing process.

8. The method of claim 1 further comprising:
applying a sealant on the photoresist on the electrode layer in the GOA region,
wherein the sealant is used for bonding the array substrate to a color film substrate.

* * * * *